United States Patent
Lin et al.

(10) Patent No.: US 6,555,424 B2
(45) Date of Patent: Apr. 29, 2003

(54) THIN FILM TRANSISTOR WITH SUB-GATES AND SCHOTTKY SOURCE/DRAIN AND A MANUFACTURING METHOD OF THE SAME

(75) Inventors: Horng-Chih Lin, Hsinchu (TW); Ming-Shih Tsai, Kaohsiung (TW); Tiao-Yuan Huang, Hsinchu (TW)

(73) Assignee: S. M. Sze, Hsinchu (TW)

( * ) Notice: Subject to any disclaimer, the term of this patent is extended or adjusted under 35 U.S.C. 154(b) by 0 days.

(21) Appl. No.: 09/879,967

(22) Filed: Jun. 14, 2001

(65) Prior Publication Data

US 2002/0009833 A1 Jan. 24, 2002

(30) Foreign Application Priority Data

Jun. 15, 2000 (TW) .......................... 89111706 A

(51) Int. Cl.$^7$ ............................. H01L 21/338
(52) U.S. Cl. ................. 438/167; 438/300; 438/581; 438/583; 438/630; 438/631; 257/280; 257/377; 257/454
(58) Field of Search ................. 438/300, 570, 438/92, 581, 582, 583, 630–631, 648, 649, 650, 651, 655, 656, 664, 682, 683, 685, 686, 721, 755, 167, 48, 330; 257/57, 377, 382, 384, 280, 413, 454, 755

(56) References Cited

U.S. PATENT DOCUMENTS 5,771,110 A * 6/1998 Hirano et al. .................. 257/72
6,255,705 B1 * 7/2001 Zhang et al. .................. 257/290

* cited by examiner

*Primary Examiner*—David Nelms
*Assistant Examiner*—Long Tran
(74) *Attorney, Agent, or Firm*—Birch, Stewart, Kolasch & Birch, LLP

(57) ABSTRACT

The present invention discloses a thin film transistor with sub-gates and Schottky source/drain and a method of manufacturing the same. Doping of source/drain, and the following annealing steps used conventionally are omitted and the complexity of process and process costs are reduced. The temperature of the process is also decreased. A thin film transistor with sub-gates and Schottky source/drain of the invention is able to operate in both the n type and p type channel modes on the same transistor element depending on the biased voltage of the sub-gate. Moreover, an electric junction is formed by induction, using bias voltage applied on the sub-gate, which takes the place of the conventional source/drain extensions. Consequently, the off-state leakage current is reduced.

9 Claims, 15 Drawing Sheets

THIN FILM TRANSISTOR WITH SUB-GATES AND SCHOTTKY SOURCE/DRAIN AND A MANUFACTURING METHOD OF THE SAME

BACKGROUND OF THE INVENTION

1. Field of the Invention

The present invention relates to a thin film transistor and a manufacturing method of the same, and more particularly, to a thin film transistor with sub-gates and Schottky source/drain and a manufacturing method of the same.

2. Description of the Prior Art

FIG. 1 shows the structural diagram of a conventional thin film transistor. In FIG. 1, 10 represents a glass or quartz substrate; 12 denotes a semiconductor layer, eg. polysilicon; 14 represents a doping area on the semiconductor 12, which serves as source/drain of the thin film transistor 1; and 16 represents gate oxide layer; and 18 represents gate.

The shortcomings of the conventional thin film transistor 1 are:

Because implant doping and the following annealing must be carried out, it is not advantageous to lower the process temperature.

Depending on the type of dopant in the source/drain, the operation mode of a thin film transistor is restricted as n type or p type, which does not allow for bi-channel operation.

Please refer to the curve a in FIG. 2., which illustrates the characteristic of drain current ($I_D$) vs gate voltage ($V_G$) of a conventional thin film NMOS transistor. From FIG. 2, it is observed that when the gate voltage is negative, there is still drain current leakage generated. This is caused by the off-stage leakage resulted from the strong field induced between the drain and gate when negative gate voltage is applied and grain boundary traps in the semiconductor 12.

SUMMARY OF THE INVENTION

The object of the present invention is to provide a novel manufacturing method for a thin film transistor with sub-gates and Schottky source/drain, which omits the steps of distribution doping in source/drain, and follow-up annealing to lower complexity and production costs. This is beneficial to lower the process temperature.

Another object of the present invention is to provide a novel thin film transistor with a sub-gate and Schottky source/drain, which allows for a transistor element to operate in both n type and p type channels by simply adjusting the biased-voltage of the sub-gate.

Another object of the present invention is to apply voltage to the sub-gate to induce the formation of an electrical junction, which takes place the conventional source/drain extension; which results in the reduction of cut-off leakage.

To achieve the above-mentioned objects, the invention discloses a first manufacturing method for forming a thin film transistor with sub-gates and Schottky source/drain, comprising the steps of:

(a)providing an insulation substrate; (b)forming two island-shaped sub-gate layers on the insulation substrate; (c)forming a first insulation layer on the island-shaped sub-gate layers and the insulation substrate; (d)forming a second insulation layer on the first insulation layer; (e)planarizing the second insulation layer to expose the first insulation layer; (f)forming an island-shaped semiconductor layer on the first and second insulation layers; (g)forming a gate dielectric layer on the surface of the island-shaped semiconductor layer; (h)forming an island-shaped main gate layer on the gate dielectric layer; (I)forming insulation spacers on the side walls of the island-shaped main gate layer and exposing the island-shaped semiconductor layer on two sides of the insulation side walls; (j)forming a metal-containing replacement layer on the island-shaped semiconductor layer of two sides of the insulation side walls; wherein the replacement layer and the island-shaped semiconductor layer existing underneath the insulation spacers form a Schottky contact, which serves as the Schottky source/drain in the thin film transistor.

To achieve the above-mentioned objects, the invention discloses a second manufacturing method for forming a thin film transistor with sub-gates and a Schottky source/drain, comprising the steps-of:

(a)providing an insulation substrate; (b)forming two island-shaped sub-gate layers on top of the insulation substrate;(c)forming a first insulation layer on the island-shaped sub-gate layer and the insulation substrate; (d)forming a second insulation layer on the first insulation layer; (e)planarizing the second insulation layer to expose the first insulation layer; (f)forming an island-shaped semiconductor layer on the first and second insulation layers; (g)forming a gate dielectric layer on the surface of the island-shaped semiconductor layer; (h)forming an island-shaped main gate layer on the gate dielectric layer; (I)forming an island-shaped mask layer to cover the island-shaped main gate layer and the gate dielectric layer located at two sides of the island-shaped main gate layer; (j)removing the gate dielectric layer on two sides of the island-shaped mask layer to expose the island-shaped semiconductor layer; (k)forming a metal-containing replacement layer on the exposed island-shaped semiconductor layer on two sides of the island-shaped mask layer; wherein the replacement layer and the island-shaped semiconductor layer existing underneath the island-shaped mask layer form a Schottky contact, which serves as the Schottky source/drain in the thin film transistor; (1) removing the island-shaped mask layer.

To achieve the above-mentioned objects, the invention discloses a third manufacturing method for forming a thin film transistor with sub-gates and Schottky source/drain, comprising the steps of:

(a)providing an insulation substrate; (b)forming an island-shaped semiconductor layer on top of the insulation substrate; (c)forming a first insulation layer, a first conductive layer and a second insulation layer on the island-shaped semiconductor layer and the insulation substrate sequentially; (d)defining and etching the second insulation layer and the first conductive layer to form two sub-gate stack layers on the first insulation layer and the island-shaped semiconductor layer; (e)forming insulation spacers on the side walls of the two sub-gate stack layers; (f)removing the first insulation layer to expose the island-shaped semiconductor layer; (g)forming a gate dielectric layer on the island-shaped semiconductor layer; (h)defining and forming a main gate layer on the gate dielectric layer between the two sub-gate stack layers; (i)removing the gate dielectric layer which is not covered by the main gate layer and the two sub-gate stack layers to expose the island-shaped semiconductor layer; (j)forming a metal-containing replacement layer on the exposed island-shaped semiconductor layer; wherein the replacement layer and the island-shaped semiconductor layer existing underneath the island-shaped insulation spacers form a Schottky contact, which serves as the Schottky source/drain in the thin film transistor.

To achieve the above-mentioned objects, the invention discloses a fourth manufacturing method for forming a thin film transistor with sub-gates and Schottky source/drain, comprising the steps of:

(a)providing an insulation substrate; (b)forming two island-shaped semiconductor layers on the insulation substrate; (c)forming a gate dielectric layer on the surface of the island-shaped semiconductor layer; (d)forming an island-shaped main gate layer on the gate dielectric layer; (e)forming insulation spacers on the side walls of the island-shaped main gate layer; (f)removing the gate dielectric layer on the two sides of the insulation spacers to expose the island-shaped semiconductor layer; (g)forming a metal-containing replacement layer on the exposed island-shaped semiconductor layer; wherein the replacement layer and the island-shaped semiconductor layer existing underneath the insulation side walls form a Schottky contact, which serves as the Schottky source/drain in the thin film transistor; (h)removing the metal layer which has not reacted to form the replacement layer; (I) forming an insulation layer to cover the main gate layer, insulation spacer, and the Schottky source/drain; (j) planarizing the insulation layer; and (k)forming an island-shaped sub-gate layer on the top of the main gate layer, the two ends of the island-shaped sub-gate layer overlap with the Schottky source/drain respectively.

To achieve the above-mentioned objects, the invention discloses a fifth manufacturing method for forming a thin film transistor with sub-gates and Schottky source/drain, comprising the steps of:

(a)providing an insulation substrate; (b)forming an island-shaped semiconductor layer on top of the insulation substrate; (c)forming a gate dielectric layer on the surface of the island-shaped semiconductor layer; (d)forming an island-shaped main gate layer on top of the gate dielectric layer; (e)forming an insulation layer to cover the island-shaped main gate layer and the gate dielectric layer; (f)defining and etching the insulation layer and gate dielectric layer, and forming an insulation mask layer to cover a first portion of the island-shaped main gate layer and the gate dielectric layer, and an insulation spacer on the side wall of second portion of the island-shaped main gate layer and the gate dielectric layer; thus the portions of island-shaped semiconductor layer not covered by the main gate, insulation mask layer, and spacer are exposed; (g)forming a metal-containing replacement layer on the insulation spacer and the exposed island-shaped semiconductor layer; wherein the replacement layer and the island-shaped semiconductor layer underneath the insulation spacer and the insulation mask layer form the Schottky contact and serve as the Schottky source and drain, respectively of the thin film transistor; (h)removing the metal layer which has not reacted in the formation of the replacement layer; (I)forming a second insulation layer covering the main gate layer, insulation spacer, insulation mask layer and the Schottky source/drain; (j)planarizing the second insulation layer; and (k)forming an island-shaped sub-gate layer over the main gate layer, and two end portions of the island-shaped sub-gate layer overlap with the Schottky source/drain respectively.

The first structure of the thin film transistor with sub-gates and Schottky source/drain of the invention is comprised of:

(1) two sub-gate structures, forming on an insulation substrate; wherein each sub-gate structure is comprised of: a sub-gate layer; and a sub-gate dielectric layer forming on the sub-gate layer; (2) a semiconductor thin film layer forming on the two sub-gate structures, and serve as the channel region of the thin film transistor; (3)two metal-containing Schottky source/drain regions formed on two sides of the channel region and forming Schottky contacts with the channel region respectively; (4)a main gate dielectric layer formed on the channel region; wherein the thickness of the main gate dielectric layer is less than the thickness of the sub-gate dielectric layer; (5)a main gate layer formed on the central area of the main gate dielectric layer to expose the main gate dielectric layer on two sides of the main gate layer; where the main gate layer and the main gate dielectric layer underneath it form a main gate structure.

The second structure of the thin film transistor with sub-gates and Schottky source/drain of the invention is comprised of: (1) a semiconductor thin film layer formed on an insulation substrate to serve as the channel region of the thin film transistor; (2)two metal-containing Schottky source/drain regions formed on two sides of the insulation, substrate and the channel region and forming Schottky contacts with the channel region, respectively; (3)two sub-gate structures formed on the channel region;; wherein each sub-gate structure is comprised of: a sub-gate dielectric layer; and a sub-gate layer formed on top of the sub-gate dielectric layer; (4)a main gate dielectric layer formed on the channel region between the two sub-gate structures; wherein the thickness of the main gate dielectric layer is less than that of the sub-gate dielectric layer; (5)a main gate layer formed on top of the main gate dielectric layer; wherein the main gate layer and the sub-gate layer are isolated from each other.

The third structure of the thin film transistor with sub-gates and Schottky source/drain of the invention is comprised of: (1) a semiconductor thin film layer formed on an insulation substrate to serve as the channel region of the thin film transistor; (2)two metal-containing Schottky source/ drain regions formed on two sides of the insulation substrate and the channel region and form Schottky contacts with the channel region respectively; (3)a main gate dielectric layer formed on the channel region; (4)a main gate layer formed on the central area of the main gate dielectric layer to expose the main gate oxide layer on two sides of the main gate layer; the main gate layer and the main gate dielectric layer underneath it forming a main gate structure; (5)a planarized insulation layer formed on the Schottky source/drain regions and the main gate structure; and (6)an island-shaped sub-gate layer formed on the insulation layer, and located over top of the main gate structure; two ends of the island-shaped sub-gate layer overlap with the Schottky source/drain regions respectively.

The forth structure of the thin film transistor with sub-gates and Schottky source/drain of the invention is comprised of: (1) a semiconductor thin film layer formed on an insulation substrate to serve as channel region of the thin film transistor; (2)two metal-containing Schottky source/ drain regions formed on the insulation substrate and two sides of the channel region and form a Schottky contact with the channel region respectively;. (3)a main gate dielectric layer formed on the channel region; (4)a main gate layer formed on the central region of the gate dielectric layer; the main gate layer and the main dielectric layer underneath it forming a main gate structure; (5)an insulation mask covering a first portion of the main gate layer and the main gate dielectric layer located on the side of the first portion of the main gate layer; (6)an insulation spacer formed on the side walls of a second portion of the main gate layer and the main gate dielectric next to the second portion of the main gate layer; (7)a planarized insulation layer formed on the Schottky source/drain region, insulation spacer, insulation mask and the main gate structure; and (8)an island-shaped sub-gate layer formed on the insulation layer, which is over top of the main gate structure; wherein the two ends of the island-shaped sub-gate layer overlap with the two Schottky source/drain regions respectively.

BRIEF DESCRIPTION OF THE DRAWINGS

The present invention will become more fully understood from the detailed description given hereinbelow and the accompanying drawings, given by way of illustration only and thus not intended to be limitative of the present invention.

PREFERRED EMBODIMENTS

1$^{st}$ Embodiment

Refer to FIGS. 3a~3i, which illustrate the cross-sectional diagrams of the process according to the first embodiment of the invention.

First, an insulation substrate 30 is provided; it is $SiO_2$ or quartz. A first conductive layer is then formed on the insulation substrate 30. The first conductive layer is then defined and etched by lithography shown in FIG. 3a, to form two island-shaped sub-gate layers 31 on the insulation substrate 30. The first conductive layer is of a material selected from metal or highly doped polysilicon. The thickness is 30~200 nm.

Figure 1:
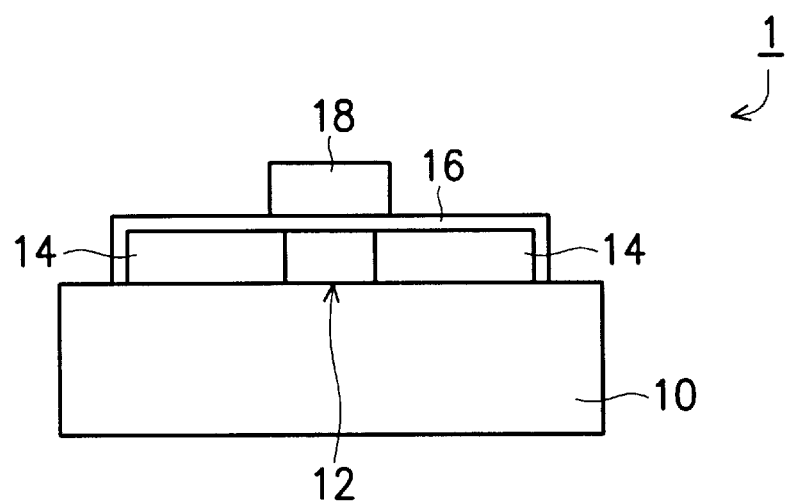
FIG. 1 illustrates the structure of a conventional thin film transistor.
Figure 2:
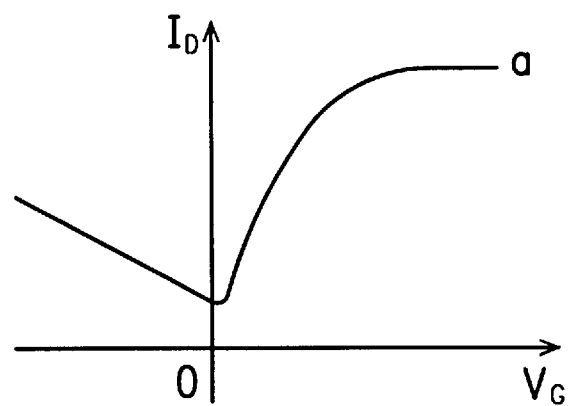
FIG. 2 shows the characteristic of drain current ($I_D$) vs main gate voltage ($V_G$) of the thin film transistor shown in FIG. 1.
Figure 3A:
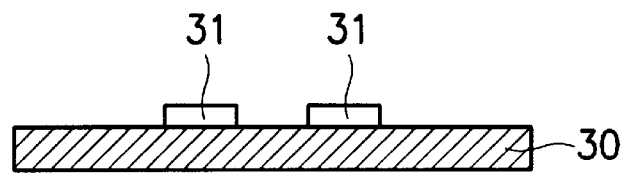
FIGS. 3a~3i show the cross-sectional diagrams according to the first embodiment of the invention.
Figure 3B:
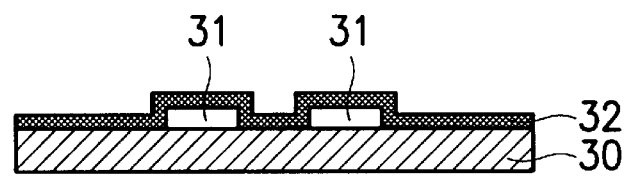

A first insulation layer 32 is conformally formed on the island-shaped sub-gate layers 31 and the insulation substrate 30, shown in FIG. 3b. The first insulator 32 is silicon nitride layer formed by CVD with a thickness from 30 to 200 nm.

Figure 3C:
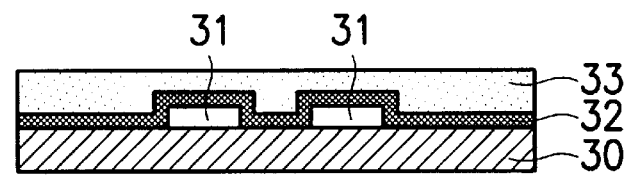

A second insulation layer 33 is formed on the first insulation layer 32, followed by chemical mechanical polishing (CMP) to planarize the surface, shown in FIG. 3c. The second insulation layer 33, for example, is oxide layer formed by CVD, and its thickness is between 30 and 1000 nm. The second insulation layer 33 is then bach-etched with BOE solution or planarized by CMP to expose the first insulation layer 32, shown in FIG. 3d.

Figure 3D:
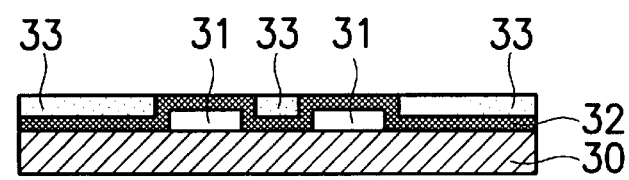

Moreover, after the formation of the second insulation layer 33, the second insulation layer can be planarized fully by CMP to expose the first insulation layer 32, shown in FIG. 3d.

Figure 3E:
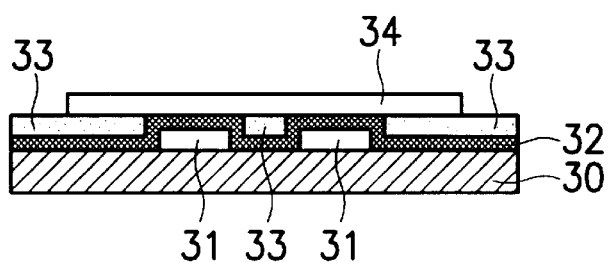

Next, a semiconductor layer is formed on the first, second insulation layer (32, 33), and it is defined and etched to form an island-shaped semiconductor 34, shown in FIG. 3e. The thickness of the island-shaped semiconductor layer 34 is between 10 and 200 nm, which is selected from amorphous silicon or polysilicon.

Figure 3F:
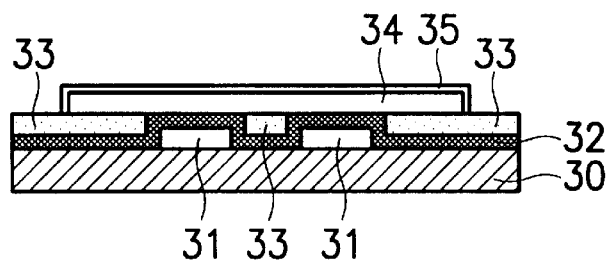
Figure 3G:
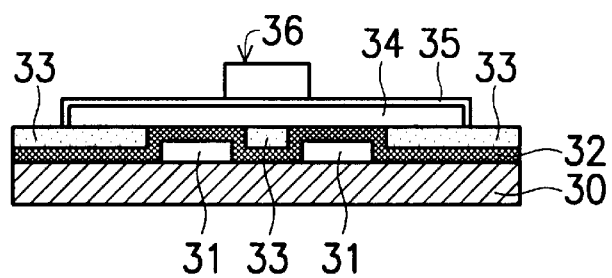

Thermal oxidation or deposition is then carried out to form a gate dielectric layer 35 on the surface of the island-shaped semiconductor layer, shown in FIG. 3f.

Subsequently, a second conductive layer is deposited on the gate dielectric layer 35 and the second insulation layer 33. The second conductive layer is then defined and etched by lithography to form an island-shaped main gate layer 36, shown in FIG. 3g. Two ends of the island-shaped main gate layer overlap respectively with the proportional areas on top of the two island-shaped sub-gate layer 31. The second conductive layer is selected from metal layer or highly doped polysilicon formed by PVD or CVD. If the island-shaped main gate layer 36 is a metal gate, a dielectric layer must be deposited on it, so that the gate becomes a stacking layers of dielectric layer/metal. The dielectric layer is silicon oxide or silicon nitride, with a thickness of 20 to 100 nm. The dielectric layer is used to protect the metal layer underneath it from damage caused by following wet etching.

Figure 3H:
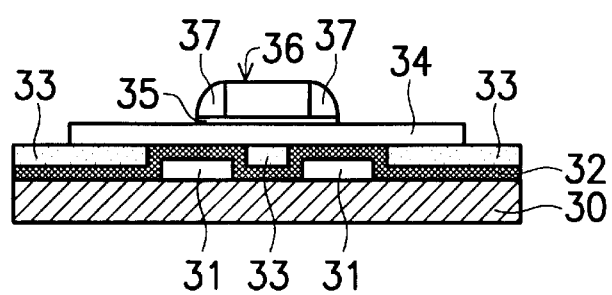

Then, a dielectric layer is deposited by CVD (e.g. oxide or silicon nitride layer), followed by back etching to form spacers 37 on the side walls of the island-shapped main gate layer 36, shown in FIG. 3h. In the process of etching the dielectric layer, the gate dielectric layer 35 on two sides of the spacers 37 is also removed to expose the island-shaped semiconductor layer 34.

A metal layer (eg. Ti, Co, Pt or Ni) is formed by PVD on the main gate layer 36, the exposed island-shaped semiconductor layer 34 and insulation spacers 37.

The metal layer is then reacted with the silicon element in the exposed island-shaped semiconductor layer 34 to form silicide 38a, 38b by rapid thermal annealing (RTA) at a temperature range of 450 to 650° C., or in a thermal furnace at a temperature range of 200 to 500° C. Selective wet etching is then carried out to strip the metal layer which has not reacted with silicon, shown in FIG. 3i.

The island-shaped semiconductor layer 34 between the silicide layers 38a and 38b is used as the channel region ch1 of the thin film transistor. The silicide layers 38a and 38b and the channel region ch1 form Schottky contacts, which serves as the Schottky source/drain of the thin film transistor.

2$^{nd}$ Embodiment

Figure 4:
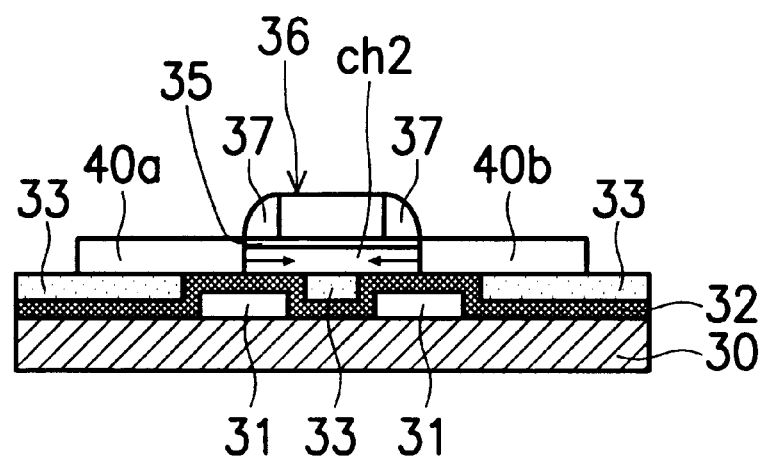
FIG. 4 shows the finished diagram according to the second embodiment of the invention.

After steps 3a~3h, Electrochemical replacing method (such as electroless plating) is used to replace the silicon in the exposed island-shaped semiconductor layer 34 with metal (such as Ni, Cu, Pd, Pt, Cu, Ag, Au or Co etc) to form metal replacement layers 40a and 40b, shown in FIG. 4.

The island-shaped semiconductor layer 34 between the metal replacement layers 40a and 40b is used as channel region ch2 of the thin film transistor. The metal replacement layers 40a and 40b and the channel region ch2 form Schottky contacts and serve as the Schottky source/drain of the thin film transistor.

In this embodiment, metal salts, such as $NiSO_4$, $PdCl_2$, $K_2PtCl_4$, $CuSO_4$, $AgSO_4$, $KAuCl_4$, $CoSO_4$ ... can be used as the precursor. The precursor is dissolved in HF solution (or BOE, $NH_4F+HF$) to become a reaction solution, which is then reacted with the silicon layer to be replaced to complete the electroless plating.

Moreover, if ch2 is amorphous silicon in this embodiment, and the replacing metal is Ni, the amorphous silicon of channel region ch2 can be recrystallized at a temperature range of 400 to 600° C. in a nitrogen- or inert gas-filled environment, so that channel region ch2 is transformed into polysilicon layer. This enhances the driving force of the thin film transistor. Arrows shown in FIG. 4 represent the direction of recrystallization.

3$^{rd}$ Embodiment

After the steps shown in FIGS. 3a~3g, an island-shaped mask layer 50 (photoresist layer is used in this embodiment) is formed to cover the island-shaped main gate layer 36 and the gate dielectric layer 35 on two sides of the island-shaped main gate layer 36.

Figure 5A:
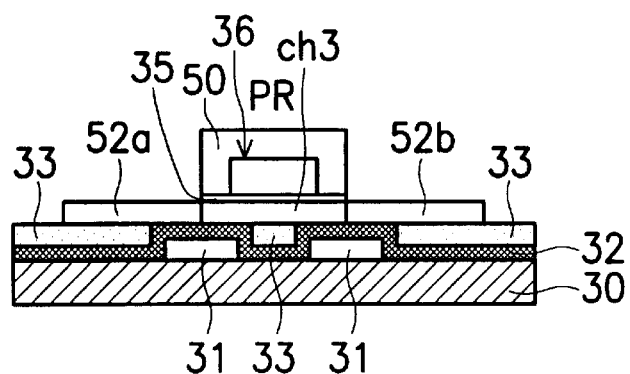
FIGS. 5a~5c show a part of the cross-sectional diagrams according to the third embodiment of the invention.

Next, the gate dielectric layer 35 on two sides of the island-shaped mask layer 50 is removed to expose the island-shaped semiconductor 34, shown in FIG. 5a.

Figure 5B:
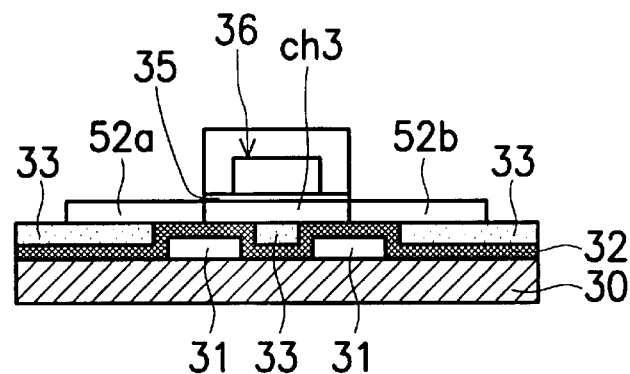

Electrochemical replacing method (eg, electroless plating) is then conducted to replace the silicon in the exposed island-shaped semiconductor layer 34 on two sides of the island-shaped mask layer 50 with metal (such as Ni, Cu, Pd, Pt, Cu, Ag, Au or Co etc) to form metal replacement layers 52a and 52b, shown in FIG. 5b.

The island-shaped semiconductor layer 34 between the metal replacement layers 52a and 52b is used as channel region ch3 of the thin film transistor. The metal replacement layers 52a and 52b and the channel region ch3 form Schottky contacts and serve as the Schottky source/drain of the thin film transistor.

Similarly, in this embodiment, metal salts, such as $NiSO_4$, $PdCl_2$, $K_2PtCl_4$, $CuSO_4$, $AgSO_4$, $KAuCl_4$, $CoSO_4$ ... can be used as the precursor. The precursor is dissolved in HF solution (or BOE, $NH_4F+HF$) to become a reaction solution, which is then reacted with the silicon layer to be replaced to complete the electroless plating.

Figure 5C:
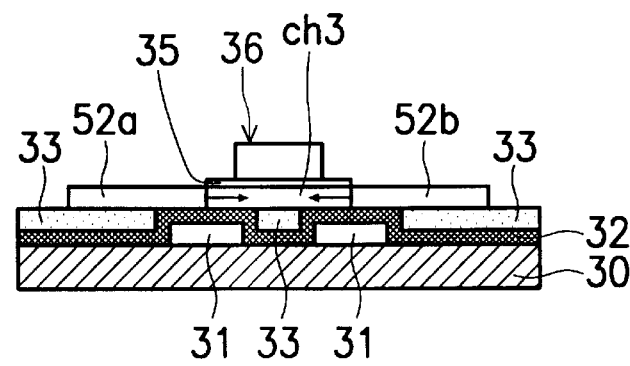

Finally, the island-shaped mask layer 50 is removed by organic solvent, shown in FIG. 5c.

Similarly, if ch3 is amorphous silicon in this embodiment, and the replacing metal is Ni, the amorphous silicon of channel region ch3 can be recrystallized at a temperature range of 400 to 600° C. in a nitrogen- or inert gas-filled environment, so that the amorphous silicon in channel region ch3 is transformed into polysilicon layer. This enhances the driving force of the thin film transistor. Arrows shown in FIG. 5c represents the direction of recrystallization.

4$^{th}$ embodiment

Refer to FIGS. 6a~6h, which illustrate the cross-sectional diagrams of the process of fourth embodiment in this invention.

First, an insulation substrate 60, of, for example, SiO2 or quartz, is provided. Next, a thin semiconductor layer is formed on the insulation substrate 60. The semiconductor layer is then defined and etched to form an island-shaped semiconductor layer 61 on the insulation substrate, shown in FIG. 6a. The thickness of the thin semiconductor is between 10 and 200 nm. The material is selected from single silicon, amorphous silicon or polysilicon.

Figure 6A:
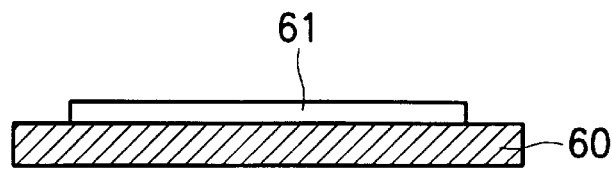
FIGS. 6a~6h show the cross-sectional diagrams according to the forth embodiment of the invention.
Figure 6B:
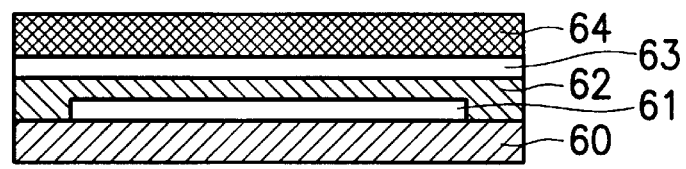

A first insulation layer 62, a first conductive layer 63 and a second insulation layer 64 are sequentially formed on the island-shaped semiconductor layer 61 and the insulation substrate 60, shown in FIG. 6b. The first insulation layer 62 is a silicon nitride layer formed by CVD with a thickness between 10 and 100 nm. The first conductive layer 63 is selected from a metal layer or highly doped polysilicon by CVD with a thickness between 30 and 200 nm. The second insulation layer 64 is an oxide layer by CVD with a thickness between 30 and 100 nm.

Figure 6C:
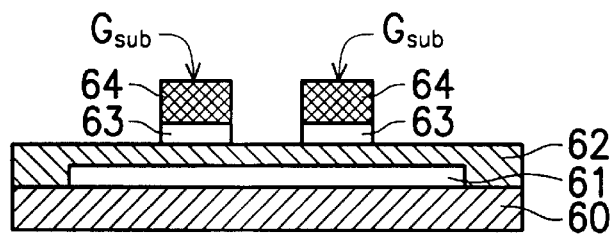
Figure 6D:
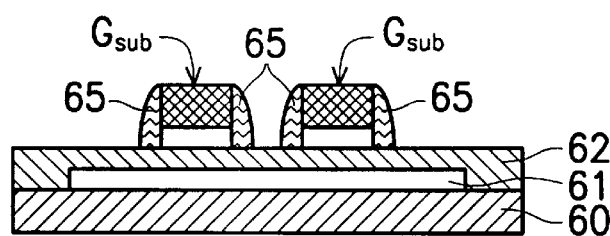

The second insulation layer 64 and the first conductive layer 63 are defined and etched to form two sub-gate stacked layers $G_{sub}$ on the first insulation layer 62, the island-shaped semiconductor layer 61, shown in FIG. 6c.

Subsequently, an oxide layer with a thickness between 30 and 200 nm is deposited on the two sub-gate stacking layers $G_{sub}$ and its side walls. The oxide layer is then anistropically etched by plasma to form spacers 65 on side walls of the two sub-gate stacking layers $G_{sub}$, shown in FIG. 6d.

Figure 6E:
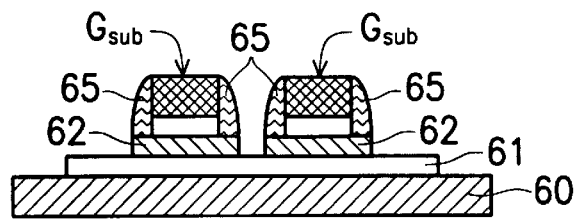

The first insulation layer 62 is then removed by plasma etching or H3PO4 solution to expose the island-shaped semiconductor 61, shown in FIG. 6e.

Figure 6F:
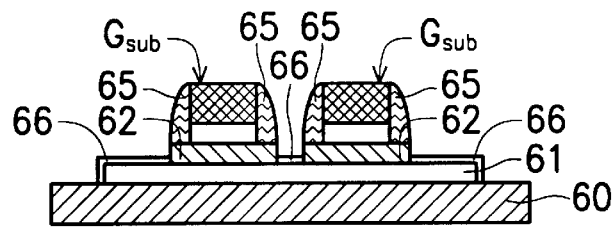
Figure 6G:
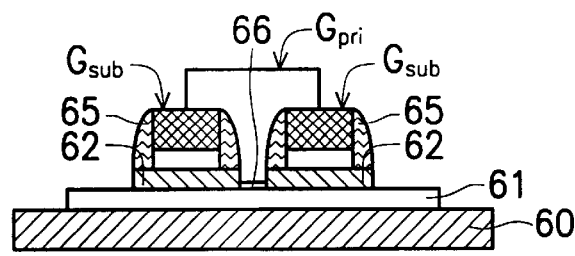

A gate dielectric layer 66 (oxide layer in this embodiment) is formed by thermal oxidation or deposition on the surface of the island-shaped semiconductor layer 61, shown in FIG. 6f.

A second conductive layer is deposited on the gate dielectric layer 66, the sub-gate stacking layer Gsub, the spacers 65 and the island-shaped semiconductor layer 61. The second conductive layer is of highly doped polysilicon formed by CVD.

The second conductive layer is then etched by lithography to form a main gate layer $G_{pri}$ on the gate dielectric layer between the two sub-gate stacking layers $G_{sub}$. Next, the gate dielectric layer 66 which is not covered by the main gate layer $G_{pri}$ and the sub-gate stacking layer $G_{sub}$ is removed by HF solution, shown in FIG. 6g.

A metal layer (such as Ti, Co, Pt, and Ni) is then formed on the main gate layer $G_{pri}$, the island-shaped semiconductor layer 61 and the insulation spacers 65 by PVD.

The metal layer is then reacted with silicon in the exposed island-shaped semiconductor layer 61 and main gate layer $G_{pri}$ by rapid thermal annealing at a temperature range of 450 to 650° C. to form silicide 67a, 67b and 68. The metal layer unreacted with silicon is then selectively removed by wet etching, shown in FIG. 6h.

The island-shaped semiconductor layer 61 between the silicide layers 67a, 67b is used as the channel region ch4 of the thin film transistor. The silicide 67a, 67b and the channel region ch4 form Schottky contacts, which serve as the Schottky source/drain of the thin film transistor.

5$^{th}$ Embodiment

Figure 7:
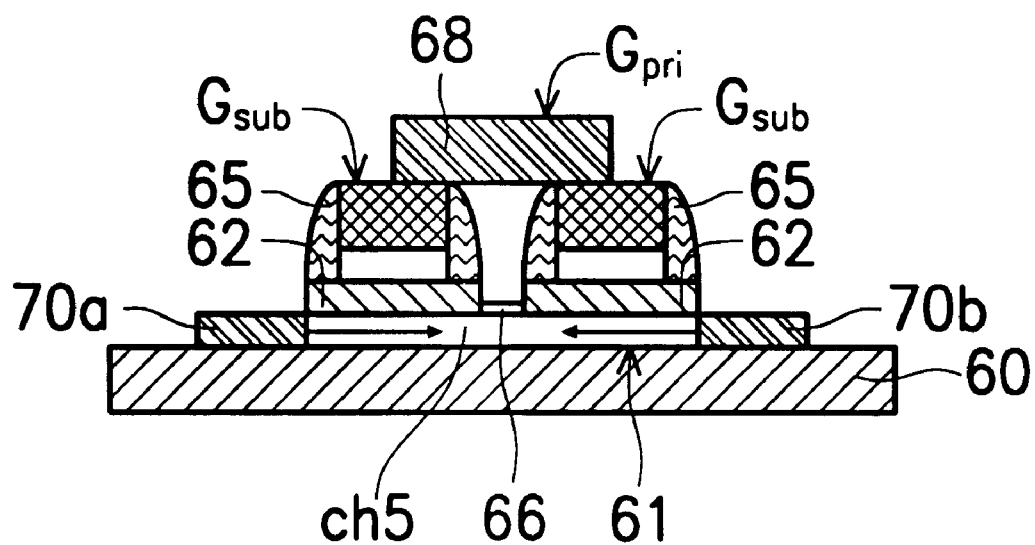
FIG. 7 shows the finished diagram according to the fifth embodiment of the invention.

After steps shown in FIGS. 6a~6g, electrochemical replacing method (eg, electroless plating) is then conducted to replace the silicon in the exposed island-shaped semiconductor layer 61 with metal (such as Ni, Cu, Pd, Pt, Cu, Ag, Au or Co etc) to form metal replacement layers 70a and 70b, shown in FIG. 7.

The island-shaped semiconductor layer 61 between the metal replacement layers 70a and 70b is used as channel region ch5 of the thin film transistor. The metal replacement layers 70a and 70b and the channel region ch5 form Schottky contacts and serve as the Schottky source/drain of the thin film transistor.

Similarly, in this embodiment, metal salts, such as $NiSO_4$, $PdCl_2$, $K_2PtCl_4$, $CuSO_4$, $AgSO_4$, $KAuCl_4$, $CoSO_4$ ... can be used as the precursor. The precursor is dissolved in HF solution (or BOE, $NH_4F+HF$) to become a reaction solution, which is then reacted with the silicon layer to be replaced to complete the electroless plating.

If ch5 is amorphous silicon in this embodiment, and the replacing metal is Ni, the amorphous silicon of channel region ch5 can be recrystallized at a temperature range of 400 to 600° C. in a nitrogen- or inert gas-filled environment, so that the amorphous silicon in channel region ch5 is transformed into a polysilicon, layer. This enhances the driving force of the thin film, transistor. Arrows shown in FIG. 7 represent the direction of recrystallization.

6$^{th}$ Embodiment

Refer to FIGS. 8a~8g, which illustrate the cross-sectional diagrams of the process of sixth embodiment in this invention.

First, an insulation substrate 80, of, for example, SiO2 or quartz is provided. Next, a thin semiconductor layer is formed on the insulation substrate 80. The semiconductor layer is then defined and etched to form an island-shaped semiconductor layer 81 on the insulation substrate, shown in FIG. 8a. The thickness of the thin semiconductor layer is between 10 and 200 nm. The material is selected from single silicon, amorphous silicon or polysilicon.

Figure 8A:
FIGS. 8a~8g show the cross-sectional diagrams according to the sixth embodiment of the invention.
Figure 8B:
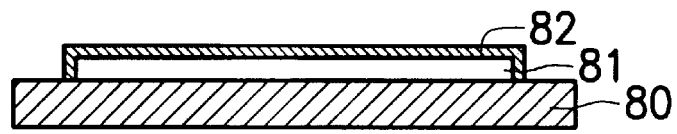

A gate dielectric layer 82 is formed on the surface of the island-shaped semiconductor 81 by thermal oxidation or CVD, shown in FIG. 8b. The gate dielectric layer 82 is oxide layer in this embodiment.

Figure 8C:
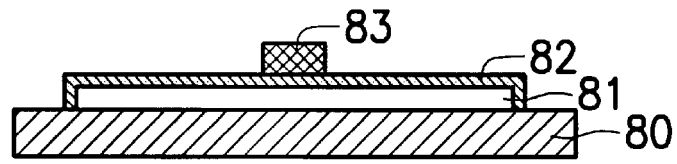

Next, a first conductive layer is formed on the gate dielectric layer 82, which is then etched by lithography to an island-shaped main gate 83, shown in FIG. 8c. The first conductive layer is of a metal layer formed by PVD or CVD or highly doped polysilicon. If the island-shaped main gate layer 83 is a metal gate, a dielectric layer must be deposited on it so that the gate becomes a dielectric layer/metal stacking layer. The dielectric layer is silicon oxide or silicon nitride with a thickness between 20 and 100 nm. The dielectric layer is used to protect the metal layer underneath it from damage by the follow-up wet etching.

Figure 8D:
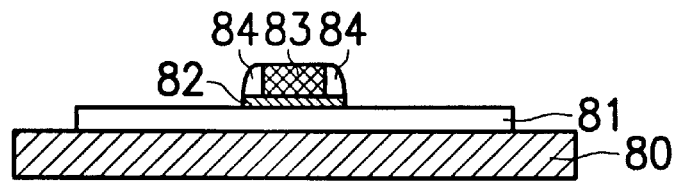
Figure 8E:
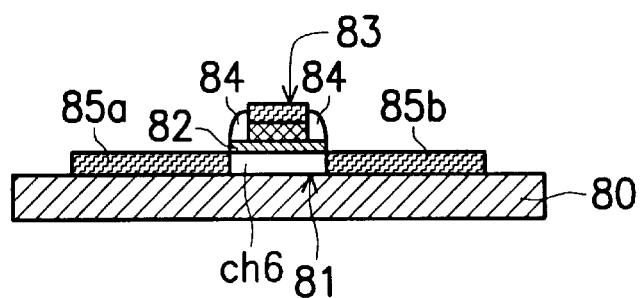
Figure 8F:
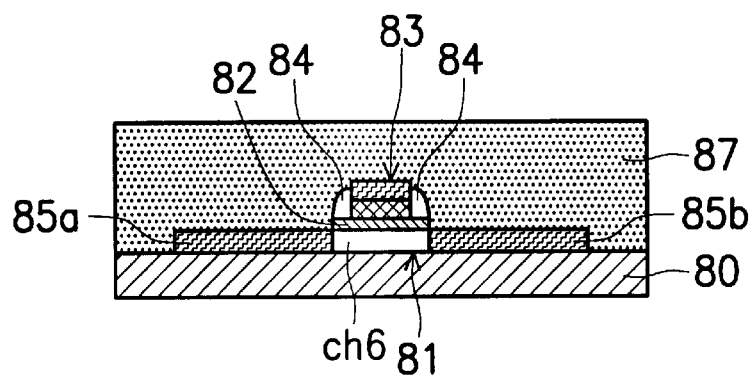

A dielectric layer (such as oxide layer or silicon nitride layer) is deposited by CVD, followed by defining and etching to form spacers- 84 on side walls of the island-shaped main gate layer 83, shown in FIG. 8d. During the process of etching the dielectric layer, the gate dielectric layer 82 on two sides of the spacers 84 is also removed to expose the island-shaped semiconductor 81.

A metal layer (such as Ti, Co, Pt, and Ni) is then formed on the main gate layer 83, the island-shaped semiconductor layer 81 and the insulation spacers 84 by PVD.

The metal layer is then reacted with silicon in the island-shaped semiconductor layer 81 by rapid thermal annealing at a temperature range of 450 to 650° C. to form silicide 85a, 85b. The metal layer unreacted with silicon is then selectively removed by wet etching, shown in FIG. 8e.

The island-shaped semiconductor layer 81 between the silicide layers 85a, 85b is used as the channel region ch6 of the thin film transistor. The silicide 85a, 85b and the channel region ch6 form Schottky contacts, which serve as the Schottky source/drain of the thin film transistor.

An insulation layer 87 with a thickness of 300 to 1000 nm is formed to cover the main gate layer 83, insulation spacers 84 and the Schottky source/drain (85a, 85b). The insulation layer 87 is then planarized, shown in FIG. 8f. The insulation layer 87 is an oxide layer formed by CVD.

Next, a second conductive layer, such as a metal layer, is formed on the insulation layer 87. The second conductive layer is then defined and etched by lithography to form an island-shaped sub-gate layer 88 on the insulation layer 87, shown in FIG. 8g. Two ends of the island-shaped sub-gate layer 88 overlap with the Schottky source/drain (85a, 85b) on two sides of the insulation spacers 87 respectively.

7$^{th}$ Embodiment

Figure 9A:
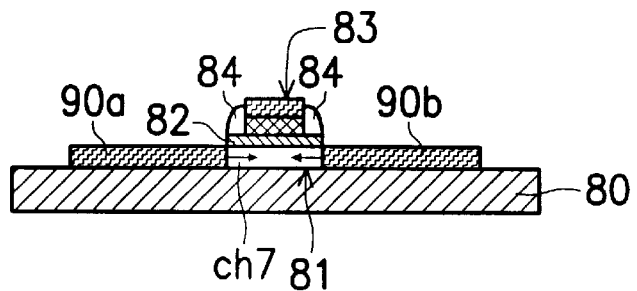
FIGS. 9a~9c show a part of the cross-sectional diagrams according to the seventh embodiment of the invention.

After steps shown in FIGS. 8a~8d, electrochemical replacing (eg, electroless plating) is then conducted to replace the silicon in the exposed island-shaped semiconductor layer 81 on two sides of the insulation spacers 84 with metal (such as Ni, Cu, Pd, Pt, Cu, Ag, Au or Co etc) to form metal replacement layers 90a and 90b, shown in FIG. 9a.

The island-shaped semiconductor layer 81 between the metal replacement layers 90a and 90b is used as channel region ch7 of the thin film transistor. The metal replacement layers 90a and 90b and the channel region ch7 form Schottky contacts and serve as the Schottky source/drain of the thin film transistor.

Similarly, in this embodiment, metal salts, such as NiSO$_4$, PdCl$_2$, K$_2$PtCl$_4$, CuSO$_4$, AgSO$_4$, KAuCl$_4$, CoSO$_4$ . . . can be used as the precursor. The precursor is dissolved in HF solution (or BOE, NH$_4$F+HF) to become a reaction solution, which is then reacted with the silicon layer to be replaced to complete the electroless plating.

If ch7 is amorphous silicon in this embodiment, and the replacing metal is Ni, the amorphous silicon of channel region ch7 can be recrystallized at a temperature range of 400 to 600° C. in a nitrogen- or inert gas-filled environment, so that the amorphous silicon in channel region ch7 is transformed into polysilicon layer. This enhances the driving force of the thin film transistor. Arrows shown in FIG. 9a represents the direction of recrystallization.

Figure 9B:
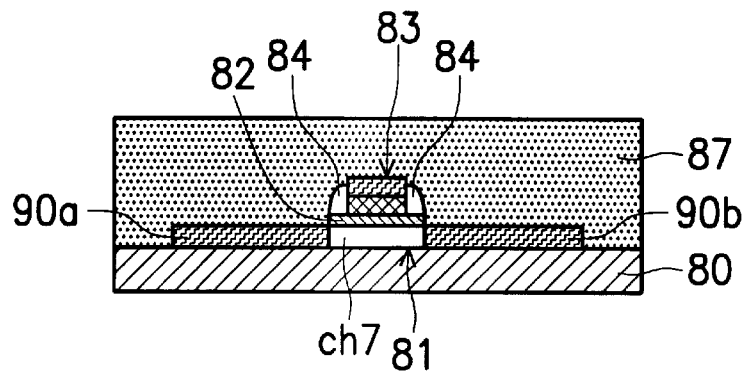

A thickness of 300~1000 nm insulation layer 87 is formed to cover the main gate layer 83, insulation spacers 84 and the Schottky source/drain (90a, 90b). The insulation layer 87 is then planarized shown in FIG. 9b.

A second conductive layer, such as metal layer, is formed on the insulation layer 87. The second conductive layer is then defined and etched by lithography to form an island-shaped sub-gate layer 88 on the insulation layer 87, shown in FIG. 9c. Two ends of the island-shaped sub-gate layer 88 overlap with the Schottky source/drain (90a, 90b) on two sides of the insulation spacers 87 respectively.

8$^{th}$ Embodiment

Refer to FIGS. 10a~10g, which illustrate the cross-sectional diagrams of the process of the eighth embodiment in this invention.

First, an insulation substrate 100, of, for example, SiO2 or quartz is provided. Next, a thin semiconductor layer is formed on the insulation substrate 100. The semiconductor layer is then defined and etched to form an island-shaped semiconductor layer 101 on the insulation substrate, shown in FIG. 10a. The thickness of the thin semiconductor layer is between 10 and 200 nm. The material is selected from single silicon, amorphous silicon or polysilicon.

Figure 10A:
FIGS. 10a~10g show the cross-sectional diagrams according to the eighth embodiment of the invention.
Figure 10B:
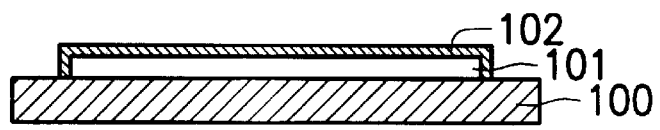

A gate dielectric layer 102 is formed on the surface of the island-shaped semiconductor 101 by thermal oxidation or CVD, shown in FIG. 10b. The gate dielectric layer 102 is an oxide layer in this embodiment.

Figure 10C:
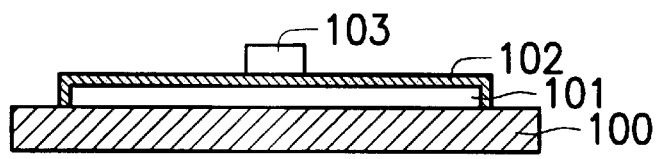

Next, a first conductive layer is formed on the gate dielectric layer 102, which is then etched by lithography to an island-shaped main gate 103, shown in FIG. 10c. The first conductive layer is of a metal layer formed by PVD or CVD or highly doped polysilicon. If the island-shaped main gate layer 103 is a metal gate, a dielectric layer must be deposited on it so that the gate becomes a dielectric layer/metal stacking layer. The dielectric layer is silicon oxide or silicon nitride with a thickness between 20 and 100 nm. The dielectric layer is used to protect the metal layer underneath it from damage by the following wet etching.

Figure 10D:
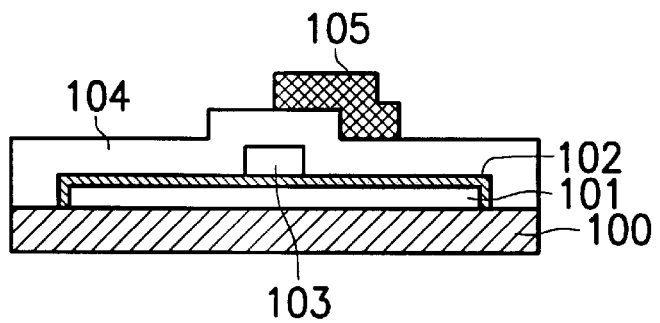
Figure 10E:
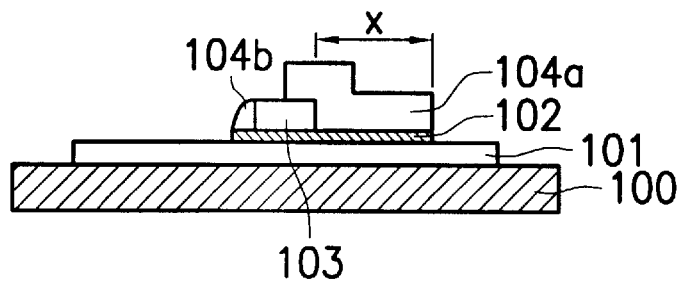
Figure 10F:
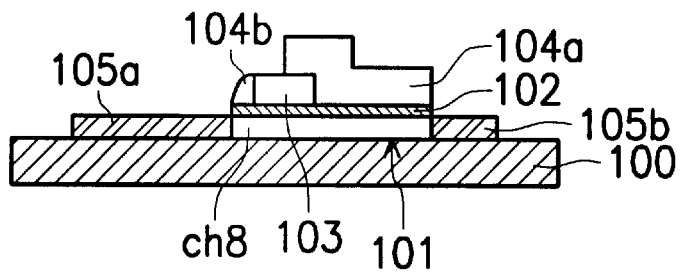

Next, a first insulation layer, for example, CVD oxide layer 104 is formed, followed by the formation of an Photoresist layer 105 on the CVD oxide layer 104 by Lithography, shown in FIG. 10d.

The photoresist layer 105 functions as a mask to etch the CVD oxide layer 104 and the gate oxide layer 102 to form an insulation mask layer 104a on a first portion of the island-shaped main gate layer 103. At the same time, an insulation spacer 104b is also formed on the side wall of a second portion of the island-shaped main gate layer 103. Thus, the island-shaped semiconductor layer 101 not covered by the main gate layer, the insulation mask layer 104a and spacer 104b are exposed, shown in FIG. 10e. It should be noted that a length x of the gate oxide layer (102) on the side of the island-shaped main gate layer 103 is covered by the insulation-mask layer 104a.

A metal layer (such as Ti, Co, Pt, and Ni) is then formed on the main gate layer 103, the island-shaped semiconductor layer 101, the insulation mask layer 104a and the insulation spacers 104b by PVD.

The metal layer is then reacted with silicon in the exposed island-shaped semiconductor layer 101 by rapid thermal annealing at a temperature range of 450 to 650° C. to form silicide 105a, 105b. The metal layer unreacted with silicon is then selectively removed by wet etching, shown in FIG. 10f.

The island-shaped semiconductor laye 101 between the silicide layers 105a, 105b is used as the channel region ch8 of the thin film transistor. The silicide 105a, 105b and the channel region ch8 form Schottky contacts, which serve as the Schottky source/drain of the thin film transistor.

A second insulation layer 107 with a thickness of 300 to 1000 nm is formed to cover the main gate layer 103, insulation spacer 104a, the insulation spacer 104b and the Schottky source/drain (105a, 105b). The insulation layer 107 is then planarized. The insulation layer 107 is of an oxide layer by CVD.

Next, a second conductive layer, such as a metal layer, is formed on the insulation layer 107. The second conductive layer is then defined and etched by lithography to form an island-shaped sub-gate layer 108 on the insulation layer 107, shown in FIG. 10g. Two ends of the island-shaped sub-gate layer 108 overlaps with the Schottky source/drain (105a, 105b) on two sides of the insulation spacer 104b and the insulation mask 104a respectively.

9th Embodiment

Figure 11A:
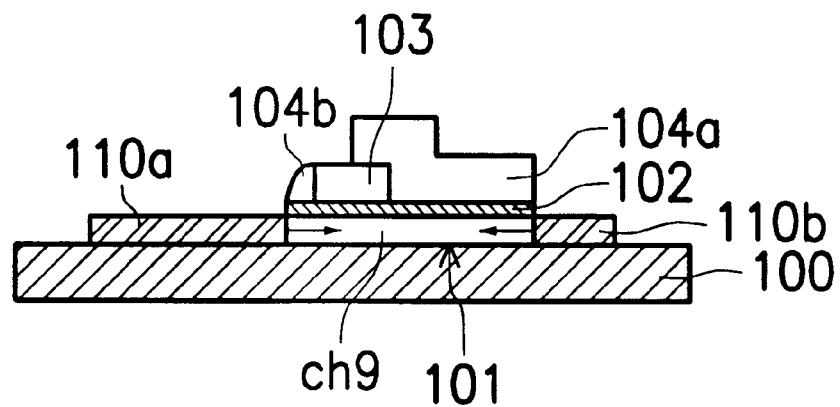
FIGS. 11a and 11b show a part of the cross-sectional diagrams according to the nineth embodiment of the invention.

After steps shown in FIGS. 10a~10e, electrochemical replacing (eg, electroless plating) is then conducted to replace the silicon in the island-shaped semiconductor layer 101 with metal (such as Ni, Cu, Pd, Pt, Cu, Ag, Au or Co etc) to form metal replacement layers 110a and 110b, shown in FIG. 11a.

The island-shaped semiconductor layer 101 between the metal replacement layers 110a and 110b is used as channel region ch9 of the thin film transistor. The metal replacement layers 110a and 110b and the channel region ch9 form Schottky contacts and serve as the Schottky source/drain of the thin film transistor.

In this embodiment, metal salts, such as $NiSO_4$, $PdCl_2$, $K_2PtCl_4$, $CuSO_4$, $AgSO_4$, $KAuCl_4$, $CoSO_4$ ... can be used as the precursor. The precursor is dissolved in HF solution (or BOE, $NH_4F+HF$) to become a reaction solution, which is then reacted with the silicon layer to be replaced to complete the electroless plating.

If ch9 is amorphous silicon in this embodiment, and the replacing metal is Ni, the amorphous silicon of channel region ch9 can be recrystallized at a temperature range of 400 to 600° C. in a nitrogen- or inert gas-filled environment, so that the amorphous silicon in channel region ch9 is transformed into polysilicon layer. This enhances the driving force of the thin film transistor. Arrows shown in FIG. 11a represents the direction of recrystallization.

A 300~1000 nm thick insulation layer 112 is formed to cover the second portion of the main gate layer 103, the insulation spacers 104b, the insulation mask 104a and the Schottky source/drain (110a, 11b). The insulation layer 112 is then planarized.

A second conductive layer, such as a metal layer, is formed on the insulation layer 112. The second conductive layer is then defined and etched by lithography to form an island-shaped sub-gate layer 114 on the insulation layer 112, shown in FIG. 11b. Two ends of the island-shaped sub-gate layer 114 overlap with the Schottky source/drain (110a, 110b) on two sides of the insulation spacers 104b and the insulation mask 104a respectively.

Figure 3I:
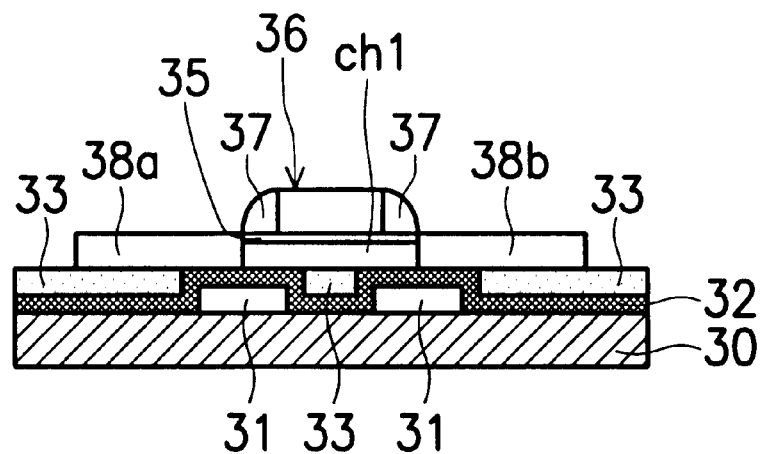

There are mainly four types of thin film transistors produced by the above 9 embodiments, and they are described as follows:

The structures of the thin film transistors with sub-gates, Schottky source/drain produced from the first, second and third embodiments are shown in FIG. 3I, FIG. 4, and FIG. 5c. Each transisor is comprised of the following units:

two sub-gate structures, formed on an insulation substrate (30); wherein each sub-gate structure is comprised of: a sub-gate layer (31); and a first insulation layer 32 (used as a sub-gate dielectric layer) formed on the sub-gate layer (31);

a semiconductor thin film layer (31) formed on the two sub-gate structures, and serving as the channel region (ch1, ch2, and ch3) of the thin film transistor;

two metal-containing Schottky source/drain regions (38a–38b, 40a–40b, or 52a–52b) formed on two sides of the channel region(ch1, ch2, and ch3) and forming Schottky contacts with the channel region respectively;

a gate dielectric layer (35) formed on the channel regions (ch1, ch2, and ch3);

a main gate layer (36) formed on the central area of the main gate dielectric layer (35) to expose the gate dielectric layer (35) on two sides of the main gate layer (36); where the main gate layer (36) and the gate dielectric layer (35) underneath it form a main gate structure.

Moreover, the thickness of the gate dielectric layer (35) in the main gate structure is less than the thickness of the first insulation layer 32 (i.e. the gate dielectric layer in the sub-gate structure). The two Schottky source/drain regions (38a–38b, 40a–40b, or 52a–52b) overlap with the sub-gate structure.

Figure 6H:
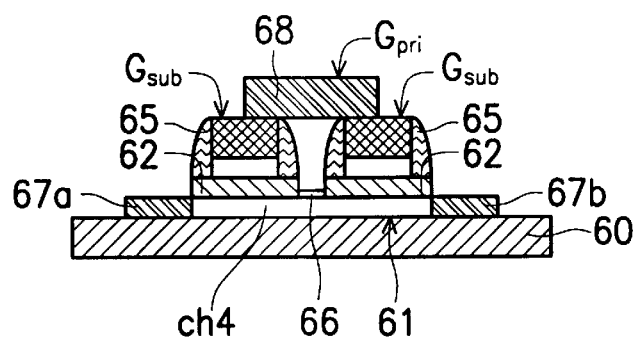

The structures of the thin film transistors with sub-gates, Schottky source/drain, produced from the forth and the fifth embodiments are shown in FIG. 6h, and FIG. 7. Each transistor is comprised of the following units:

a semiconductor thin film layer (61) formed on an insulation substrate (60) to serve as the channel regions (ch4, ch5) of the thin film transistor;

two metal-containing Schottky source/drain regions (67a–67b, or 70a–70b) formed on two sides of the insulation substrate (60) and the channel regions (ch4 or ch5) form a Schottky contacts with the channel regions (ch4 or ch5) respectively;

two sub-gate structures $G_{sub}$ formed on the channel regions (ch4 or ch5); a main gate structure $G_{pri}$ formed on the channel regions (ch4 or ch5) and between the two sub-gate structures $G_{sub}$; wherein the thickness of the gate dielectric layer (62) of the main gate structure $G_{pri}$ is less than that of the gate dielectric layer (62) of the sub-gate structure $G_{sub}$; the conductive part of the main gate structure $G_{pri}$ and the conductive part (obtained from etching the first conductive layer 63) of the two sub-gate structures $G_{sub}$ are isolated from each other.

Figure 8G:
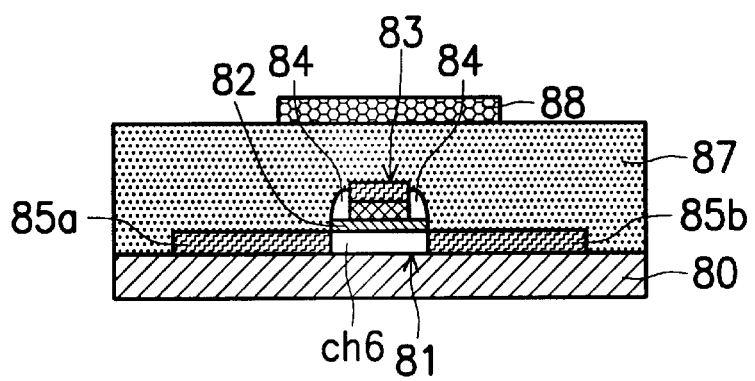
Figure 9C:
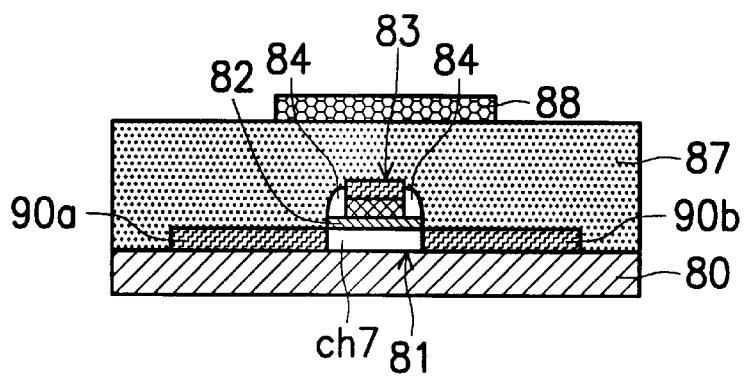

The structures of the thin film transistors with sub-gates, Schottky source/drain produced from the sixth and the seventh embodiments are shown in FIG. 8g, and FIG. 9c. Each transistor is comprised of the following units:

a semiconductor thin film layer (81) formed on an insulation substrate (80) to serve as the channel region of the thin film transistor;

two metal-containing Schottky source/drain regions (85a–85b, or 90a–90b) formed on two sides of the insulation substrate (80) and the channel region form a Schottky contacts with the channel region respectively;

a gate dielectric layer (82) formed on the thin film semiconductor layer (81); a main gate layer (83) formed on central area of the gate dielectric layer (82) to expose the main gate oxide layer (82) on two sides of the main gate layer (83); the main gate layer (83) and the main gate dielectric layer (82) underneath it form a main gate structure;

a planarized insulation layer (87) formed on the Schottky source/drain regions and the main gate structure; and a sub-gate layer (88) formed on the insulation layer (87), and located on top of the main gate structure; two ends of the island-shaped sub-gate layer overlap with the Schottky source/drain regions (85a–85b, or 90a–90b) respectively.

Figure 10G:
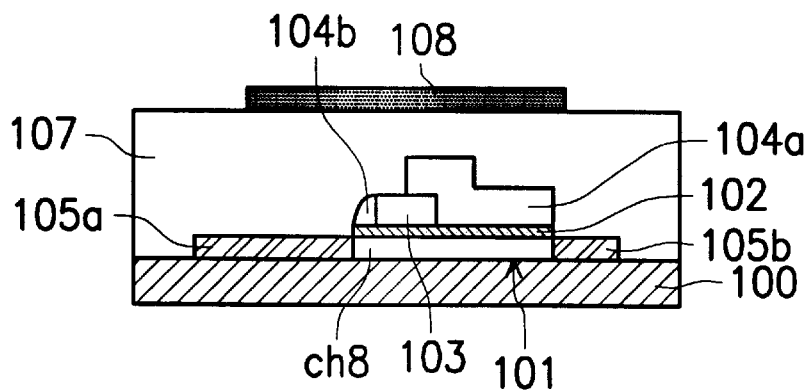
Figure 11B:
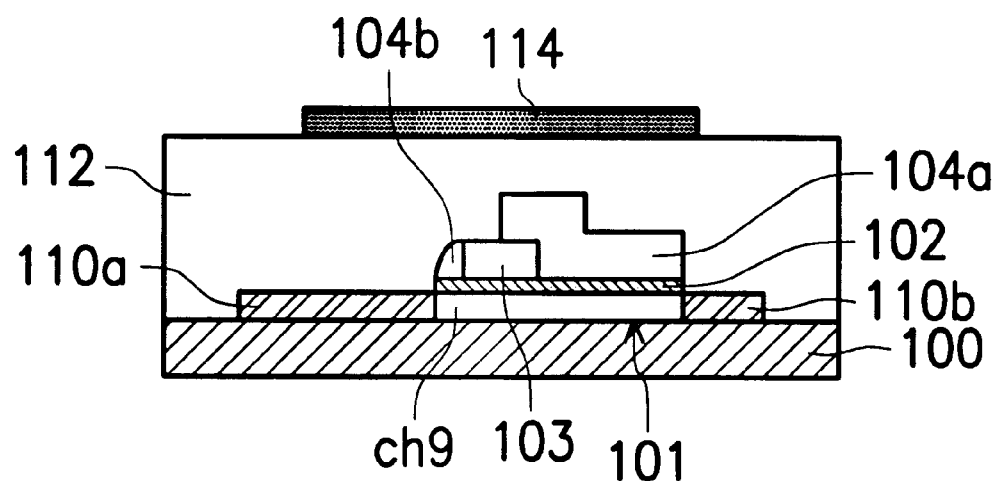

The structures of the thin film transistors with sub-gates, Schottky source/drain produced from the eighth and the nineth embodiments are shown in FIG. 10g, and FIG. 11b. Each transistor is comprised of the following units:

a semiconductor thin film layer (101) formed on an insulation substrate (100) to serve as channel region of the thin film transistor;

two metal-containing Schottky source/drain regions (105a–105b, or 100a–100b)formed on the insulation substrate (100) and two sides of the channel region form a Schottky contact with the channel region respectively;

a gate dielectric layer (102) formed on the semiconductor thin film layer (101); a main gate layer (103) formed on central region of the gate dielectric layer (102) to expose the gate oxide layer (102) on two sides of the main gate layer (103); the main gate layer (103) and the main dielectric layer (102) underneath it form a main gate structure;

an insulation mask (104a) covering a first portion of the main gate layer (103) and the main gate dielectric layer (102) located on the side of the first portion of the main gate layer;

an insulation spacer (104b) formed on the side walls of a second portion of the main gate layer (103) and the main gate dielectric layer (102) next to the second portion of the main gate layer (103);

a planarized insulation layer (107 or 112) formed on the Schottky source/drain region, insulation spacer, insulation mask and the main gate structure; and an island-shaped sub-gate layer (108 or 114) formed on the insulation layer (107 or 112), which is on top of the main gate structure; wherein the two ends of the island-shaped sub-gate layer overlap with the two Schottky source/drain regions (105a–105b, or 100a–100b) respectively.

Figure 12A:
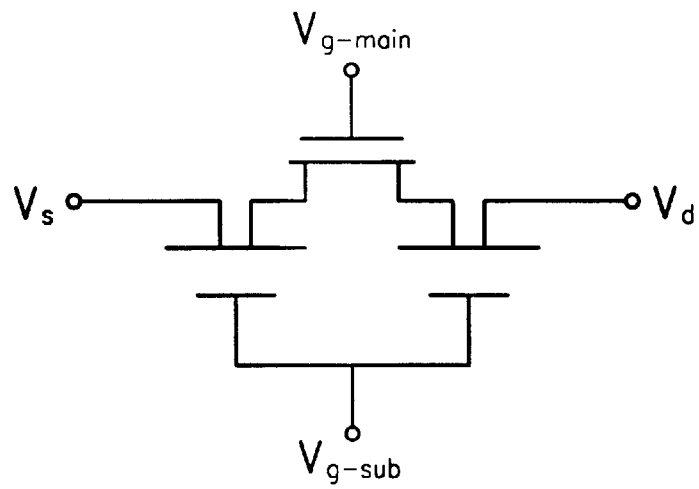
FIGS. 12a and 12b show the equivalent circuit of the thin film transistor with sub-gates and Schottky source/drain and its characteristics.
Figure 12B:
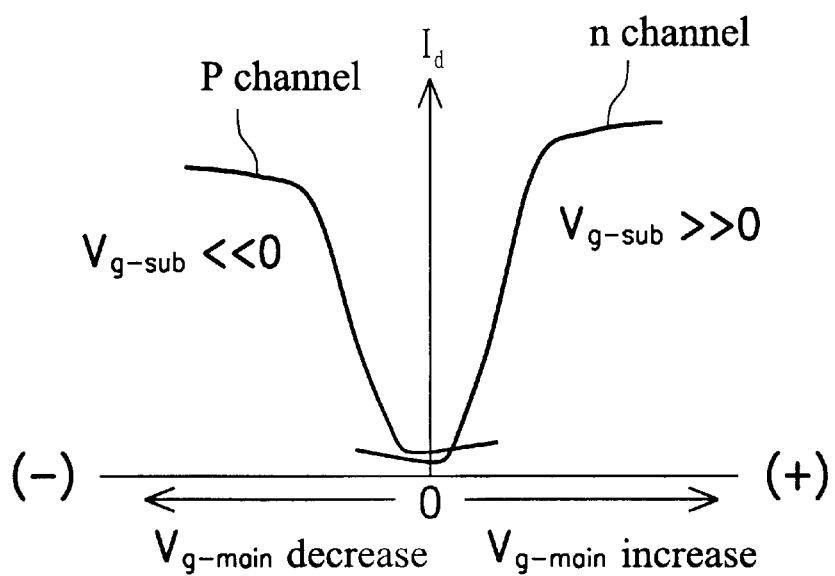

The equivalent circuits of the thin film transistors with sub-gates and Schottky source/drain as described above and their characteristics are shown respectively in FIGS. 12a and 12b. In FIG. 12a, $V_{g\text{-}main}$ represents the voltage applied on the main gate; $V_{g\text{-}sub}$ represents the voltage applied on the two sub-gates. $V_s$ and $V_d$ represent voltages applied on Schottky source/drain respectively.

The biased voltage $V_{g\text{-}sub}$ of the sub-gate is mainly used to determine the channel type of the element. ① when Vg-sub is positive and much greater than 0V, the channel offset region between the main gate and the Schottky source/drain will induce an electron layer. This electron layer serves as the S/D extension region and is used to lower the contact resistance of the Schottky source/drain. Therefore, under these circumstances, the biased $V_{g\text{-}main}$ of the main gate is adjusted to obtain an element with n type channel, shown in FIG. 12b.

② Similarly, when $V_{g\text{-}sub}$ is nevative and much smaller than 0V, the channel offset region between the main gate and the Schottky source/drain regions will induce a hole layer with positive charges. An element with p type channel is obtained, shown in FIG. 12b.

From the above, it is not necessary to carry out implant doping and the following annealing steps in this invention. Therefore, the complexity and costs of the process are decreased. This is also advantageous in lowering the process temperature. Moreover, by adjusting the biased voltage of $V_{g\text{-}sub}$, a single device is able to operate in both n type and p type channels.

This invention utilizes the application of voltage to the sub-gate to induce electrical junction, which takes the place of the conventional source/drain extensions. As a result, off-state leakage is decreased.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A manufacturing method for a thin film transistor with sub-gates and Schottky source/drain, comprising:

providing an insulation substrate;

forming an island-shaped semiconductor layers on the insulation substrate;

forming a gate dielectric layer on the surface of the island-shaped semiconductor layer;

forming an island-shaped main gate layer on the gate dielectric layer;

forming insulation spacers on the side walls of the island-shaped main gate layer;

removing the gate dielectric layer on the two sides of the insulation spacers to expose the island-shaped semiconductor layer;

forming a metal-containing replacement layer on the island-shaped semiconductor layer exposed; wherein the replacement layer and the island-shaped semiconductor layer existing underneath the insulation spacers form a Schottky contact, which serves as the Schottky source/drain in the thin film transistor;

removing the metal layer which has not reacted to form the replacement layer;

forming an insulation layer to cover the main gate layer, insulation spacers, and the Schottky source/drain;

planarizing the insulation layer; and forming an island-shaped sub-gate layer over the top of the main gate layer, the two ends of the island-shaped sub-gate layer overlap with the Schottky source/drain respectively.

2. The method as claimed in claim 1, wherein the method for forming the replacement layer comprises:

forming a metal layer on the main gate layer, exposed island-shaped semiconductor layer and insulation spacers;

thermal-processing and reacting the metal layer and the exposed island-shaped semiconductor layer to form the replacement layer; and removing the metal layer which has not reacted to become the replacement layer.

3. The method as claimed in claim 2, wherein the island-shaped semiconductor layer is a silicon layer; the thermal process is carried out in a rapid thermal reactor at a temperature range of 450–650° C.; or in a thermal furnace at a temperature range of 200–500° C.

4. The method as claimed in claim 1, wherein the material of the metal layer is selected from Ti, Co, Pt or Ni.

5. The method as claimed in claim 1, wherein the replacement layer is obtained by electroless plating.

6. The method as claimed in claim 5, wherein a metal salt is used as the precursor, which is dissolved in a solution to become a reaction solution for electroless plating; the reaction solution is then reacted with the exposed portions of the semiconductor layer to obtain the replacement layer.

7. A thin film transistor with sub-gates and Schottky source/drain, which is produced according to the method as claimed in claim 1.

8. A manufacturing method for a thin film transistor with sub-gates and Schottky source/drain, comprising:

providing an insulation substrate;

forming an island-shaped semiconductor layer of silicon on the insulation substrate;

forming a gate dielectric layer on the surface of the island-shaped semiconductor layer;

forming an island-shaped main gate layer on the gate dielectric layer;

forming insulation spacers on the side walls of the island-shaped main gate layer;

removing the gate dielectric layer on the two sides of the insulation spacers to expose the island-shaped semiconductor layer;

forming a metal layer of Ti, Co, Pt or Ni by electroless plating, on the main gate layer, exposed island-shaped semiconductor layer and insulation spacers; wherein a metal salt of $Ni^{2+}$, $Pd^{2+}$, $Pt^{2+}$, $Cu^{2+}$, $Ag^+$, $Au^{3+}$, or $Co^{2+}$ is used as the precursor, which is dissolved in a HF, BOE, or $NH_4F+HF$ solution to become a reaction solution for electroless plating; the reaction solution is then reacted with the exposed portions of the semiconductor layer to obtain the replacement layer;

thermal-processing and reacting the metal layer and the exposed island-shaped semiconductor layer in a rapid thermal reactor at a temperature range of 450–650° C.; or in a thermal furnace at a temperature range of 200–500° C. to form the replacement layer; wherein the replacement layer and the island-shaped semiconductor layer existing underneath the insulation spacers form a Schottky contact, which serves as the Schottky source/drain in the thin film transistor;

removing the unreacted metal layer to become the metal-containing replacement layer;

forming an insulation layer to cover the main gate layer, insulation spacers, and the Schottky source/drain;

planarizing the insulation layer; and forming an island-shaped sub-gate layer over the top of the main gate layer, the two ends of the island-shaped sub-gate layer overlap with the Schottky source/drain respectively.

9. A manufacturing method for a thin film transistor with sub-gates and Schottky source/drain, comprising:

providing an insulation substrate;

forming an island-shaped semiconductor layer of silicon on the insulation substrate;

forming a gate dielectric layer on the surface of the island-shaped semiconductor layer;

forming an island-shaped main gate layer on the gate dielectric layer;

forming insulation spacers on the side walls of the island-shaped main gate layer;

removing the gate dielectric layer on the two sides of the insulation spacers to expose the island-shaped semiconductor layer;

forming a metal layer using precursor containing $Ni^{2+}$ by electroless plating, on the main gate layer, exposed island-shaped semiconductor layer and insulation spacers; the precursor is dissolved in a HF, BOE, or $NH_4F+HF$ solution to become a reaction solution for electroless plating; the reaction solution is then reacted with the exposed portions of the semiconductor layer to obtain the replacement layer;

subjecting the island-shaped semiconductor layer underneath the insulation spacers and the island-shaped main gate layer to recrystallization at a temperature of 400–600° C. in a nitrogen- or inert gas-filled environment;

thermal-processing and reacting the metal layer and the exposed island-shaped semiconductor layer in a rapid thermal reactor at a temperature range of 450–650° C.; or in a thermal furnace at a temperature range of 200–500° C. to form the replacement layer; wherein the replacement layer and the island-shaped semiconductor layer existing underneath the insulation spacers form a Schottky contact, which serves as the Schottky source/drain in the thin film transistor;

removing the unreacted metal layer to become the metal-containing replacement layer;

forming an insulation layer to cover the main gate layer, insulation spacers, and the Schottky source/drain;

planarizing the insulation layer; and forming an island-shaped sub-gate layer over the top of the main gate layer, the two ends of the island-shaped sub-gate layer overlap with the Schottky source/drain respectively.

* * * * *